US009142403B2

(12) United States Patent
Kadonaga et al.

(10) Patent No.: US 9,142,403 B2
(45) Date of Patent: *Sep. 22, 2015

(54) METHOD OF FORMING BORON-CONTAINING SILICON OXYCARBONITRIDE FILM AND METHOD OF FORMING SILICON OXYCARBONITRIDE FILM

(71) Applicant: TOKYO ELECTRON LIMITED, Tokyo (JP)

(72) Inventors: Kentaro Kadonaga, Nirasaki (JP); Keisuke Suzuki, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/846,030

(22) Filed: Mar. 18, 2013

(65) Prior Publication Data
US 2013/0260576 A1    Oct. 3, 2013

(30) Foreign Application Priority Data

Mar. 27, 2012   (JP) ................................. 2012-072419

(51) Int. Cl.
*H01L 21/02*  (2006.01)
*C23C 16/28*  (2006.01)
*C23C 16/30*  (2006.01)
*C23C 16/34*  (2006.01)
(Continued)

(52) U.S. Cl.
CPC ............ *H01L 21/0226* (2013.01); *C23C 16/28* (2013.01); *C23C 16/308* (2013.01); *C23C 16/342* (2013.01); *C23C 16/36* (2013.01); *C23C 16/45525* (2013.01); *H01L 21/0228* (2013.01); *H01L 21/02126* (2013.01); *H01L 21/02129* (2013.01); *H01L 21/02211* (2013.01)

(58) Field of Classification Search
CPC ...................... H01L 21/0226; H01L 23/53295; H01L 2924/10324; H01L 21/02126; H01L 21/0214; H01L 21/02167; H01L 21/0217; H01L 35/22; H01L 21/31; H01L 21/022; H01L 21/0228; H01L 21/02129; H01L 21/02211; C23C 16/36; C23C 16/342; C23C 16/345; C23C 16/347; C23C 16/38; C23C 14/0664; C23C 14/06676; C23C 14/0647; C23C 28/42; C23C 16/24; C23C 16/56; C23C 28/04; C23C 8/34; C23C 16/28; C23C 16/308; C23C 16/45525
See application file for complete search history.

(56) References Cited

U.S. PATENT DOCUMENTS 8,753,717 B2 * 6/2014 Suzuki et al. ............. 427/249.5
2002/0094378 A1 * 7/2002 O'Donnell et al. ........ 427/249.1
(Continued)

FOREIGN PATENT DOCUMENTS

JP       2006-13503 A     1/2006
JP       2006-287194 A    10/2006
(Continued)

*Primary Examiner* — Jarrett Stark
*Assistant Examiner* — Bitew Dinke
(74) *Attorney, Agent, or Firm* — Nath, Goldberg & Meyer; Jerald L. Meyer

(57) ABSTRACT

According to an embodiment of the present disclosure a method of forming a boron-containing silicon oxycarbonitride film on a base is provided. The method includes forming a boron-containing film on the base, and forming the boron-containing silicon oxycarbonitride film by laminating a silicon carbonitride film and a silicon oxynitride film on the boron-containing film.

10 Claims, 22 Drawing Sheets

(51) Int. Cl.
*C23C 16/36* (2006.01)
*C23C 16/455* (2006.01)

(56) References Cited

U.S. PATENT DOCUMENTS

| | | | |
|---|---|---|---|
| 2003/0201540 A1* | 10/2003 | Ahn et al. | 257/760 |
| 2006/0205231 A1* | 9/2006 | Chou et al. | 438/770 |
| 2007/0087575 A1* | 4/2007 | Iyer et al. | 438/758 |
| 2007/0111546 A1* | 5/2007 | Iyer et al. | 438/791 |
| 2007/0207628 A1* | 9/2007 | Chua | 438/769 |
| 2007/0222003 A1* | 9/2007 | Matsushita et al. | 257/411 |
| 2008/0213479 A1* | 9/2008 | Chou et al. | 427/255.393 |
| 2008/0292798 A1* | 11/2008 | Huh et al. | 427/343 |
| 2009/0104764 A1* | 4/2009 | Xia et al. | 438/595 |
| 2011/0294280 A1* | 12/2011 | Takasawa et al. | 438/478 |
| 2012/0184110 A1* | 7/2012 | Hirose et al. | 438/763 |
| 2012/0321791 A1* | 12/2012 | Suzuki et al. | 427/255.38 |
| 2013/0052836 A1* | 2/2013 | Hirose et al. | 438/762 |
| 2013/0087923 A1* | 4/2013 | Gates et al. | 257/773 |
| 2013/0164946 A1* | 6/2013 | Suzuki et al. | 438/778 |
| 2013/0260562 A1* | 10/2013 | Park et al. | 438/702 |

FOREIGN PATENT DOCUMENTS

| | | |
|---|---|---|
| JP | 2008-227460 A | 9/2008 |
| JP | 2011-192875 A | 9/2011 |
| JP | 2011-238894 A | 11/2011 |

* cited by examiner

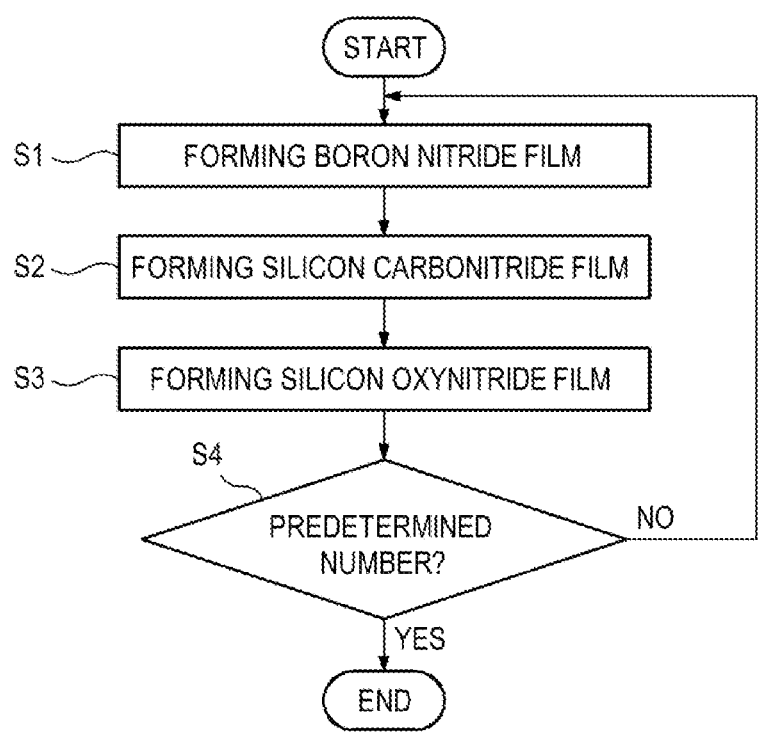

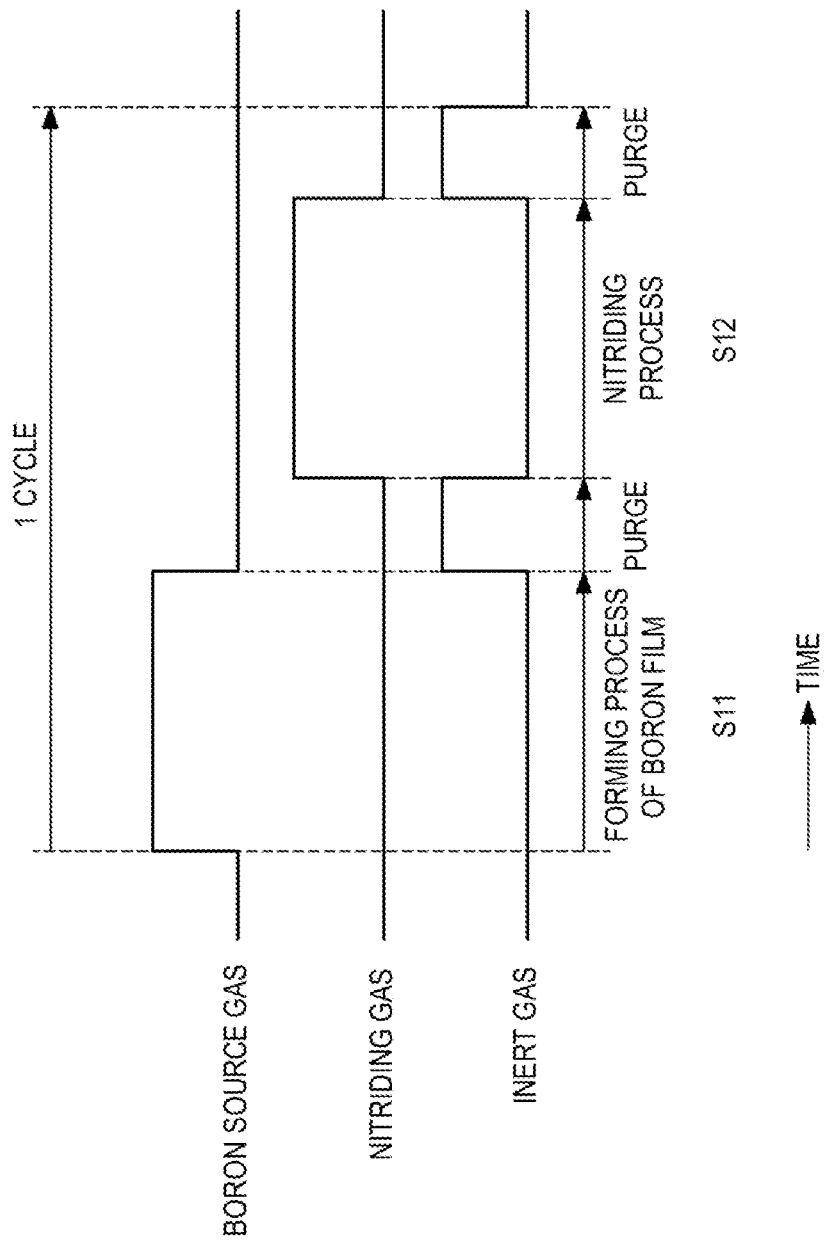

BORON SOURCE GAS

NITRIDING GAS

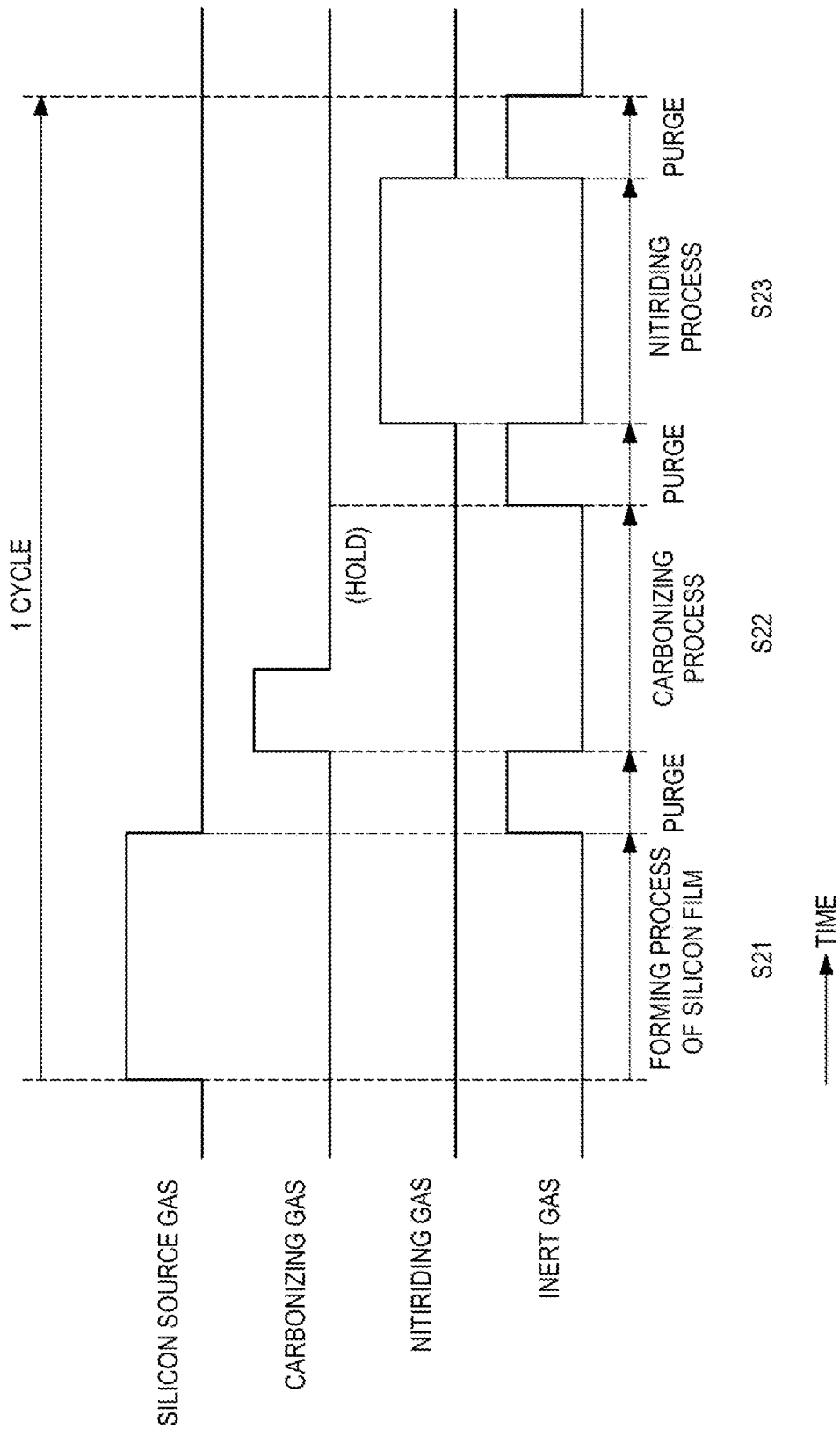

SILICON SOURCE GAS

CARBONIZING GAS

NITIRIDING GAS

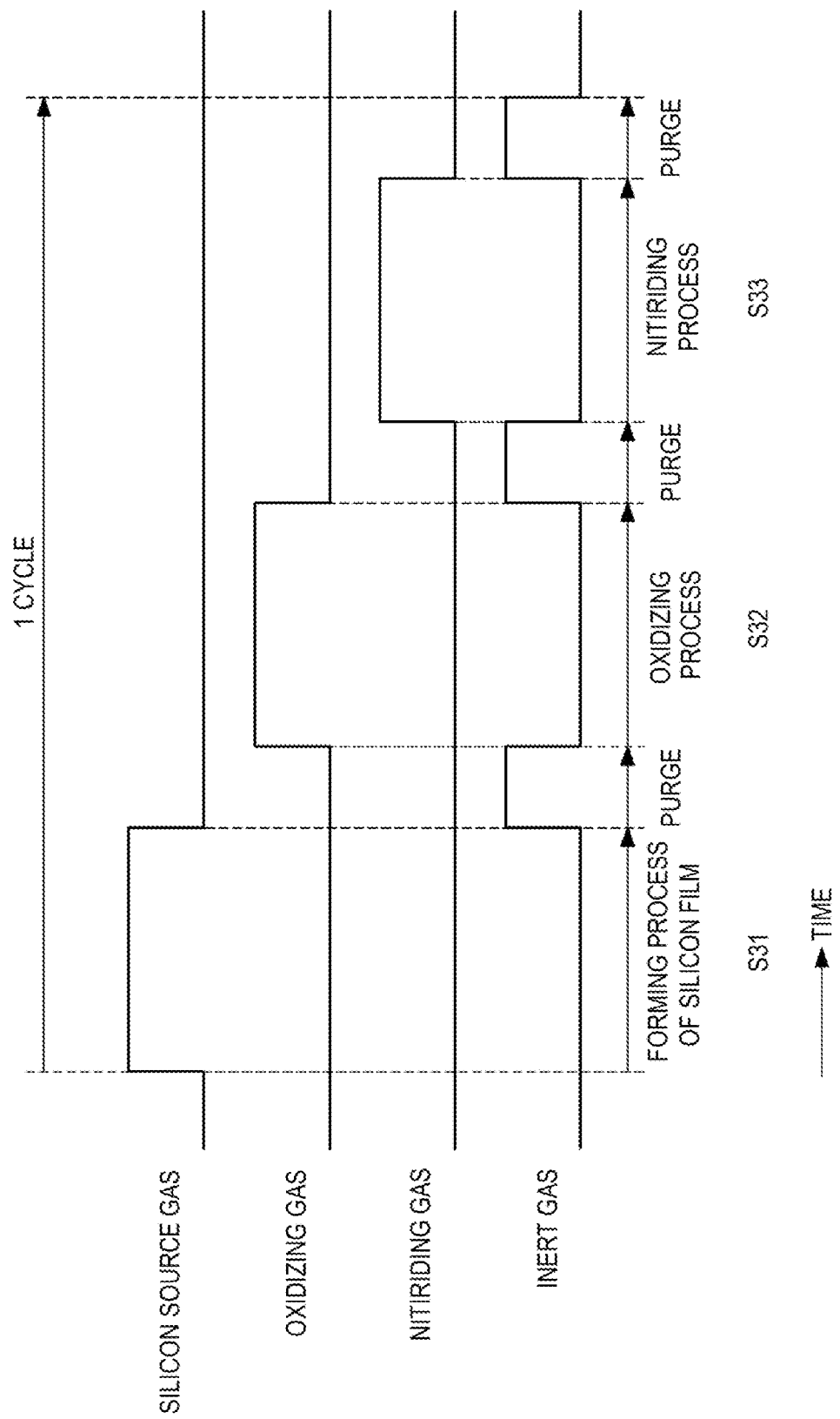

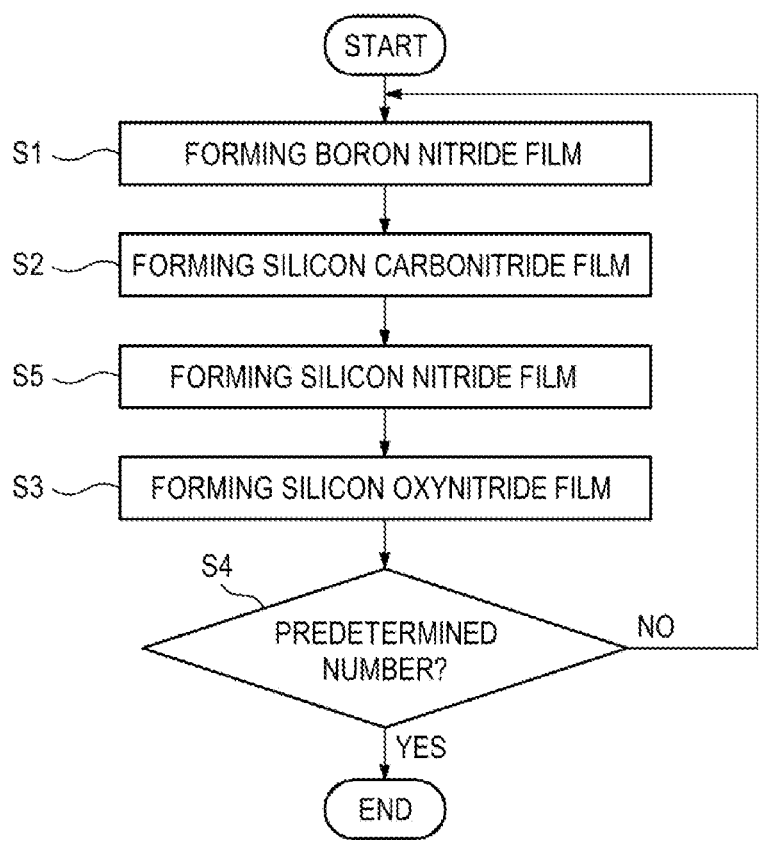

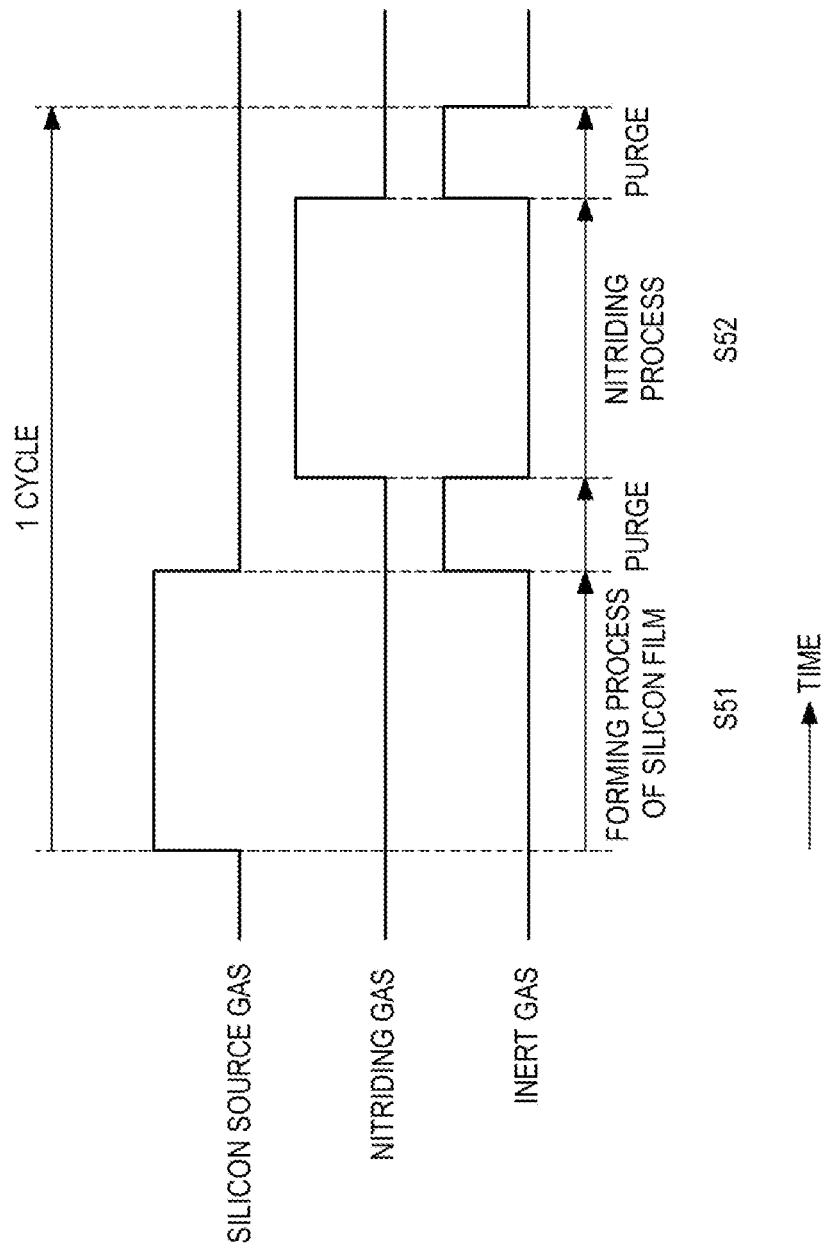

METHOD OF FORMING BORON-CONTAINING SILICON OXYCARBONITRIDE FILM AND METHOD OF FORMING SILICON OXYCARBONITRIDE FILM

CROSS-REFERENCE TO RELATED APPLICATION

This application claims the benefit of and priority to Japanese Patent Application No. 2012-072419, filed on Mar. 27, 2012, in the Japan Patent Office, the disclosure of which is incorporated herein in its entirety by reference.

TECHNICAL FIELD

The present disclosure relates to a method of forming a boron-containing silicon oxycarbonitride film and a method of forming a silicon oxycarbonitride film.

BACKGROUND

In a scale-down of a semiconductor integrated circuit device, e.g., from a 3Xnm node to a 2Xnm node and to an under-2Xnm node, the amount of a parasitic capacitance around a gate electrode cannot be ignored any longer. Generally, a side wall insulation film is formed around the gate electrode, and the side wall insulation film includes several types of films, e.g., a stress liner, an offset spacer and a side wall spacer. A silicon nitride film (SiN film), which has a higher relative permittivity compared to a silicon oxide film ($SiO_2$ film), has widely been used as the side wall insulation film. Thus, there is a need for lowering the permittivity of the side wall insulation film, particularly for replacing the side wall insulation film with an insulation film having a relative permittivity equal to or lower than that of the silicon nitride film.

In order to implement a low permittivity of the side wall insulation film, some insulation films had been reviewed and a silicon oxycarbonitride film (SiOCN film) may be used as one possible solution.

Although in the past, a method of forming a silicon oxycarbonitride film has been used, there is no disclosure of applying the silicon oxycarbonitride film to the side wall insulation film.

The side wall insulation film is formed around the gate electrode by processing the insulation film through an anisotropic dry etching such as a RIE method. Such side wall insulation film is exposed to various etching process during a manufacturing process of the semiconductor integrated circuit device.

For example, if the gate electrode, a source diffusion layer and a drain diffusion layer are subject to a silicide technology, they are exposed to a wet etching after performing a dry etching and before forming a metal film. Thereafter, they are exposed to the dry etching or the wet etching when removing an unreactive portion of the metal film.

Further, if a self-aligned contact technology is applied, the side wall insulation film is exposed to the anisotropic dry etching such as the RIE method when forming a contact hole as an interlayer insulation film. Therefore, the insulation film, which is used for the side wall insulation film, should be provided to have an excellent resistance when exposed to a dry etching process and/or a wet etching process.

Further, recently, there is a need for enhancing productivity in the field of manufacturing semiconductor integrated circuit devices. Particularly, as one solution for enhancing productivity, an enhancement of a throughput (e.g., enhancing a growth rate of a film to reduce a processing time) becomes increasingly important.

SUMMARY

The present disclosure provides in some embodiments a method of forming a boron-containing silicon oxycarbonitride film, which can enhance throughput by reducing processing time.

Further, the present disclosure also provides in some embodiments, a method of forming a silicon oxycarbonitride film, which can form a silicon oxycarbonitride film with excellence in both a dry etching resistance and a wet etching resistance.

According to a first aspect of the present disclosure, a method of forming a boron-containing silicon oxycarbonitride film on a base is provided. The method includes forming a boron-containing film on the base, and forming the boron-containing silicon oxycarbonitride film by laminating a silicon carbonitride film and a silicon oxynitride film on the boron-containing film.

According to a second aspect of the present disclosure, a method of forming a silicon oxycarbonitride film on a base is provided. The method includes forming the silicon oxycarbonitride film by laminating a silicon carbonitride film, a silicon nitride film and a silicon oxynitride film on the base.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a flow chart showing one example of a method of forming a boron-containing silicon oxycarbonitride film according to a first embodiment of the present disclosure.

FIG. 5 is a timing chart showing one example of gas discharge timing.

FIG. 8 is a timing chart showing one example of gas discharge timing.

FIG. 11 is a timing chart showing one example of gas discharge timing.

FIG. 13 is a flow chart showing one example of a method of forming a boron-containing silicon oxycarbonitride film according to a second embodiment of the present disclosure.

FIG. 17 is a timing chart showing one example of gas discharge timing.

DETAILED DESCRIPTION

Figure 2A:
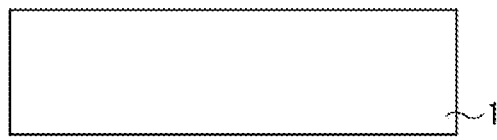
FIGS. 2A to 2G are sectional views showing one example of main processes in the method of forming the boron-containing silicon oxycarbonitride film according to the first embodiment.

An embodiment of the present disclosure will now be described with reference to the drawings. The same reference numerals will be assigned to the same elements through all of the drawings.

First Embodiment

FIG. 1 is a flow chart showing one example of a method of forming a boron-containing silicon oxycarbonitride film according to a first embodiment of the present disclosure. FIGS. 2A to 2G are sectional views showing one example of main processes in the method of forming the boron-containing silicon oxycarbonitride film according to the first embodiment.

First, as shown in FIG. 2A, a semiconductor substrate is prepared. In this example, a silicon wafer 1 is used as the semiconductor substrate. Subsequently, the silicon wafer 1 is accommodated in a processing chamber of a film formation apparatus.

Figure 2B:
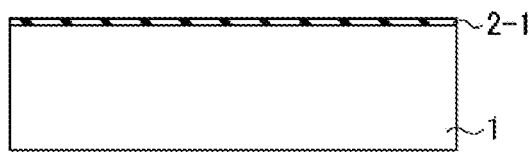

As shown in operation S1 of FIG. 1 and FIG. 2B, a boron nitride film 2-1 (BN film) is then formed on a base, for example, a surface to be processed of the silicon wafer 1. Further, the surface to be processed of the silicon wafer 1 is not limited to the silicon, and may be a silicon oxide film such as $SiO_2$ and a silicon nitride film such as SiN.

Figure 2C:
Figure 2D:
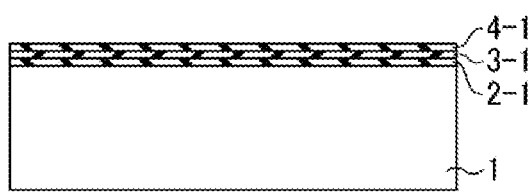

Next, as shown in operation S2 of FIG. 1 and FIG. 2C, a silicon carbonitride film 3-1 (SiCN film) is formed on the boron nitride film 2-1, and then, a silicon oxynitride film 4-1 is formed on the silicon carbonitride film 3-1, as shown in operation S3 of FIG. 1 and FIG. 2D. In this case, the silicon carbonitride film 3-1 and the silicon oxynitride film 4-1 are laminated. Thus, one cycle of a film formation sequence of the boron-containing silicon oxycarbonitride film is completed after performing all of the above described operations.

Next, as shown in operation S4 of FIG. 1, it is determined whether a lamination number reaches a predetermined number. If the lamination number reaches the predetermined number (Yes), forming the boron-containing silicon oxycarbonitride film is finished. If the lamination number is "1", the boron-containing silicon oxycarbonitride film (SiBOCN film) is formed by laminating the boron nitride film 2-1, the silicon carbonitride film 3-1 and the silicon oxynitride film 4-1 one layer by one layer. In case the lamination number is fixed to "1", operation S4 can be omitted.

Figure 2E:
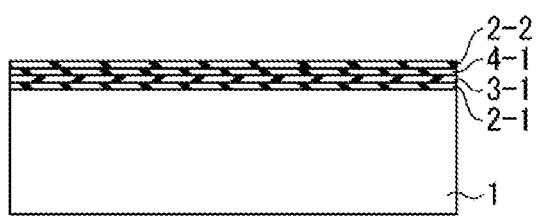
Figure 2F:
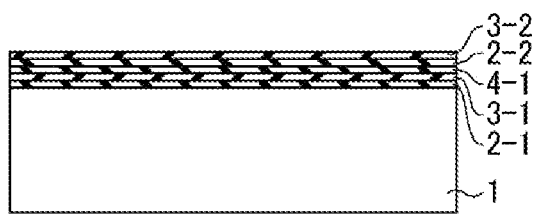
Figure 2G:
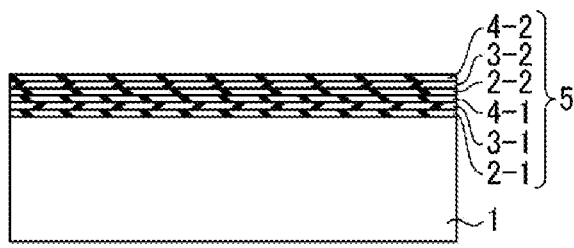

If the lamination number does not reach the predetermined number (No), the process returns to operation S1. Then, a second layered boron nitride film 2-2 is formed on the silicon oxynitride film 4-1, as shown in FIG. 2E. Then, as shown in operation S2 of FIG. 1 and FIG. 2F, a second layered silicon carbonitride film 3-2 is formed. Next, as shown in operation S3 of FIG. 1 and FIG. 2G, a second layered silicon oxynitride film 4-2 is formed.

Next, as shown in operation S4 of FIG. 1, it is again determined whether a lamination number reaches the predetermined number. If the lamination number reaches the predetermined number (Yes), the process of forming the boron-containing silicon oxycarbonitride film is completed. If the lamination number does not reach the predetermined number (No), operations S1 to S3 shown in FIG. 1 are repeatedly performed until the lamination number reaches the predetermined number. With this configuration, the boron-containing silicon oxycarbonitride film is formed.

In the method of forming the boron-containing silicon oxycarbonitride film according to the first embodiment, the silicon carbonitride film 3 and the silicon oxynitride film 4 are laminated after forming of the boron nitride film 2 on the base. In this case, the boron-containing silicon oxycarbonitride film 5 is formed by laminating the boron nitride film 2, the silicon carbonitride film 3 and the silicon oxynitride film 4. Accordingly, it is possible to enhance a growth rate of the boron-containing silicon oxycarbonitride film 5 to thereby reduce a processing time.

Figure 3:
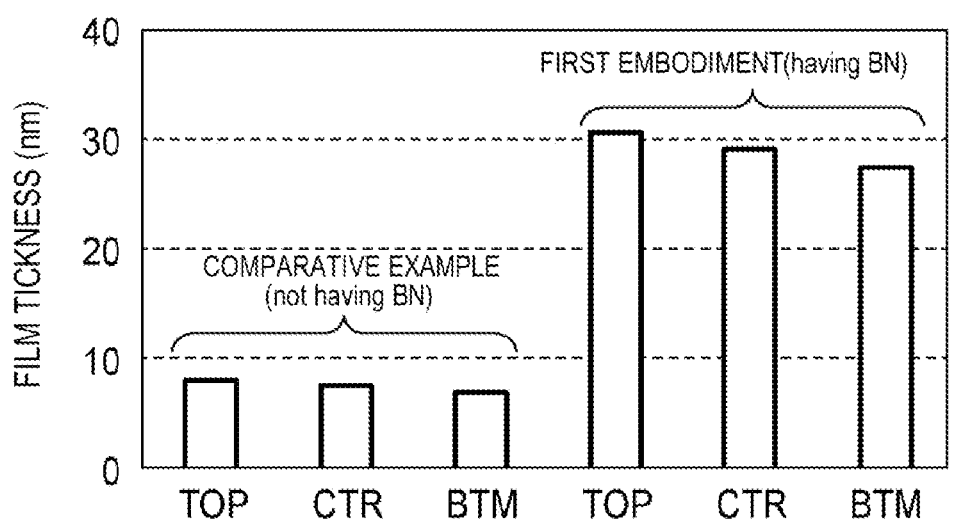
FIG. 3 shows a film thickness per one cycle in the boron-containing silicon oxycarbonitride film (having BN) according to the first embodiment and a silicon oxycarbonitride film (not having BN) according to a comparative example.

FIG. 3 shows a film thickness per one cycle in the boron-containing silicon oxycarbonitride film (having BN) according to the first embodiment and a silicon oxycarbonitride film (not having BN) according to a comparative example.

As shown in FIG. 3, it is possible to increase a film thickness per one cycle to about three times when compared the first embodiment with a comparative example.

According to the first embodiment, the silicon carbonitride film 3 is formed after the boron nitride film 2 is formed on the base such as the silicon wafer 1 or the silicon oxynitride film 4, etc. That is, the silicon carbonitride film 3 is formed on the boron nitride film 2. Accordingly, due to a catalytic action (a reaction catalyst) of a surface of the boron nitride film 2, a silicon source gas which is used to form the silicon carbonitride film 3, for example, DCS is easily absorbed on the base comparing with the case the base is a silicon, a silicon oxide film, a silicon nitride film, or the silicon oxynitride film 4. Thus, it is possible to enhance particularly the growth rate of the silicon film to thereby enhance the growth rate of the silicon carbonitride film 3 by using the catalytic action and making the silicon source gas absorbed on the base easier.

Further, an advantage of using the boron nitride film 2 as the catalyst is to form the boron-containing silicon oxycarbonitride film 5 by putting the boron nitride film 2 into the silicon oxycarbonitride film. The boron-containing silicon oxycarbonitride film 5 has a lower relative permittivity than a silicon oxycarbonitride film without boron. In this way, the boron-containing silicon oxycarbonitride film 5, which has the lower relative permittivity than the silicon oxycarbonitride film without boron, may be used, for example, as low permittivity materials of a semiconductor integrated circuit, effective materials for lowering a permittivity of a side wall insulation film etc.

Further, a result shown in FIG. 3 is obtained when a film is formed by using a vertical batch-type film formation apparatus. In the drawings, "TOP", "CTR" and "BTM" indicate average values of film thicknesses of the silicon wafers 1 disposed on a top portion, a center portion and a bottom portion of a wafer boat, respectively. One example of the vertical batch-type film formation apparatus will be described later.

Next, one example of a detailed film formation sequence will be described in operations S1, S2 and S3.

<Operation S1: An Example of a Method of Forming a Boron Nitride Film 2>

Figure 4:
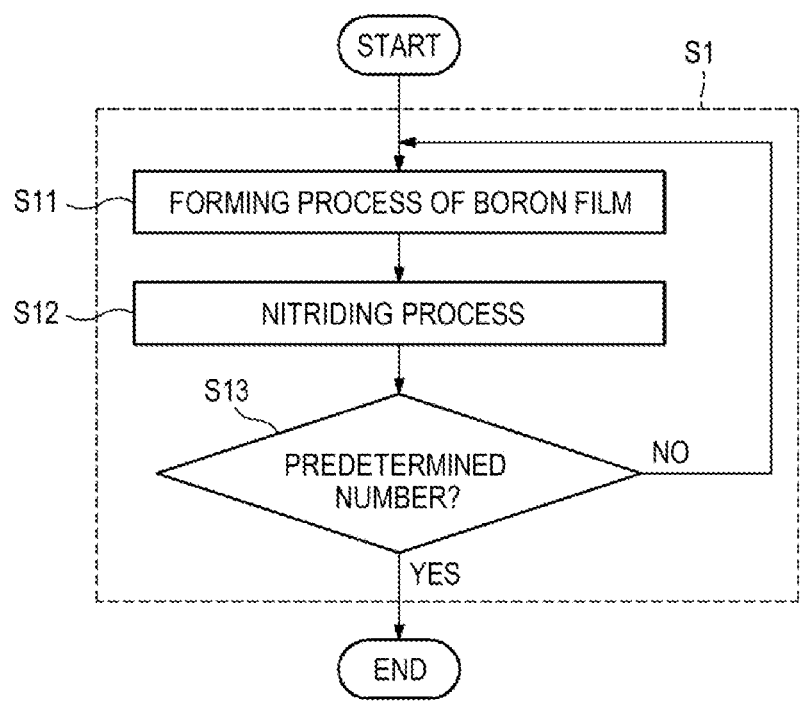
FIG. 4 is a flow chart showing one example of a film formation sequence of a boron nitride film.
Figure 6A:
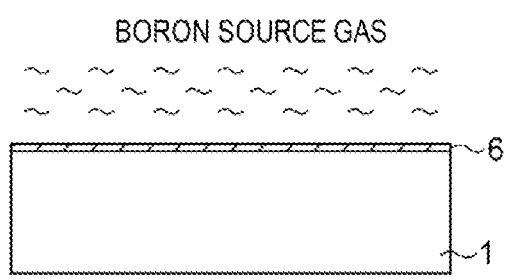
FIGS. 6A and 6B are sectional views showing one example of main processes in the film formation sequence of the boron nitride film.
Figure 6B:
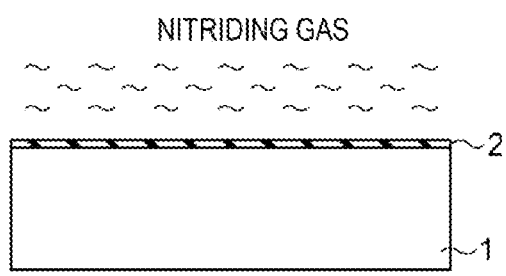

FIG. 4 is a flow chart showing one example of a film formation sequence of the boron nitride film 2. FIG. 5 is a timing chart showing one example of a gas discharge timing. FIGS. 6A and 6B are sectional views showing one example of main processes in the film formation sequence of the boron nitride film 2.

First, as shown in operation S11 of FIG. 4, FIG. 5 and FIG. 6A, a boron film 6 (B film) is formed on a surface to be processed of the silicon wafer 1 by supplying a boron source gas into an interior of the processing chamber of the film formation apparatus, which accommodates the silicon wafer 1.

One example of processing conditions when forming the boron film 6 is as follows:
 a boron source gas: a boron trichloride ($BCl_3$);
 a flow rate of the boron source gas: 1.5~400 sccm;
 a processing time: 3~60 min;
 a processing temperature: 450~630 degrees C.; and
 a processing pressure: 66.7~1333 Pa (0.5~10 Torr).

In the above processing conditions, the boron film 6 with the film thickness of about 0.2~1.0 nm is formed on the surface to be processed of the silicon wafer 1.

When operation S11 is finished, the interior of the processing chamber is purged by using an inert gas. An internal atmosphere of the processing chamber is substituted with an inert gas atmosphere. One example of the inert gas may be a nitrogen gas ($N_2$).

Next, as shown in operation S12 of FIG. 4, FIG. 5 and FIG. 6B, the boron film 6 formed on the surface to be processed of the silicon wafer 1 is nitrided to produce a boron nitride film 2 (BN film) by supplying a nitriding gas into the interior of the processing chamber.

One example of processing conditions when nitriding the boron film 6 is as follows:
 a nitriding gas: an ammonia ($NH_3$);
 a flow rate of a nitriding gas: 1000~10000 sccm;
 a processing time: 0.1~3.0 min;
 a processing temperature 450~630 degrees C.; and
 a processing pressure: 13.3~666.5 Pa (0.1~5.0 Torr).

When operation S12 is finished, the interior of the processing chamber is purged by using the inert gas. The internal atmosphere of the processing chamber is substituted with the inert gas atmosphere, for example, a nitrogen gas atmosphere in this example. Hereby, one cycle of the film formation sequence of the boron nitride film 2 is completed.

Next, as shown in operation S13 of FIG. 4, it is determined whether a cycle number reaches a predetermined number. If the cycle number reaches the predetermined number (Yes), forming the boron nitride film 2 is completed. If the cycle number does not reach the predetermined number (No), the film formation sequence returns to operation S11 and repeatedly performs operations S11 and S12. Further, in case the cycle number is fixed to "1", operation S13 can be omitted.

Accordingly, for example, the boron nitride film 2 is formed.

<Operation S2: An Example of a Method of Forming the Silicon Carbonitride Film 3>

Figure 7:
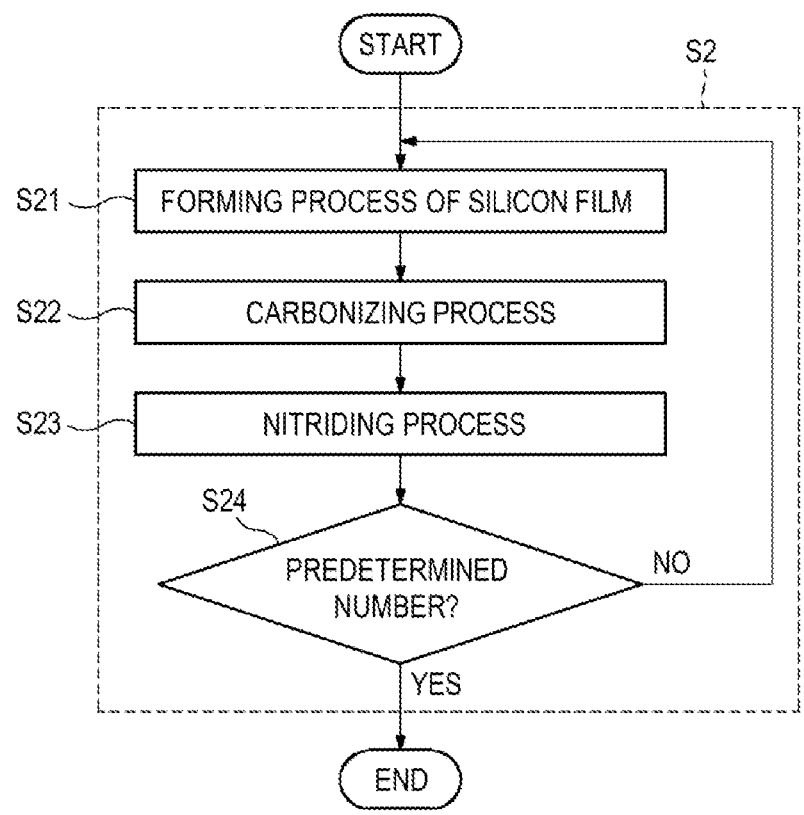
FIG. 7 is a flow chart showing one example of a film formation sequence of a silicon carbonitride film.
Figure 9A:
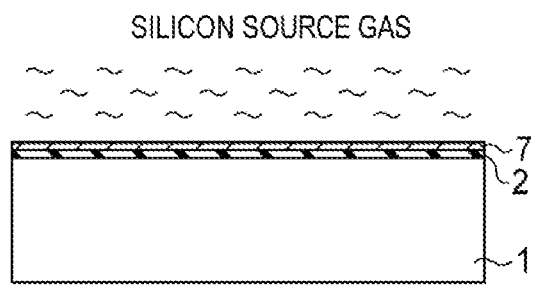
FIGS. 9A to 9C are sectional views showing one example of main processes in the film formation sequence of the silicon carbonitride film.
Figure 9B:
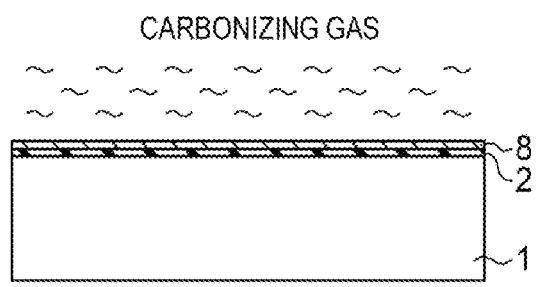
Figure 9C:
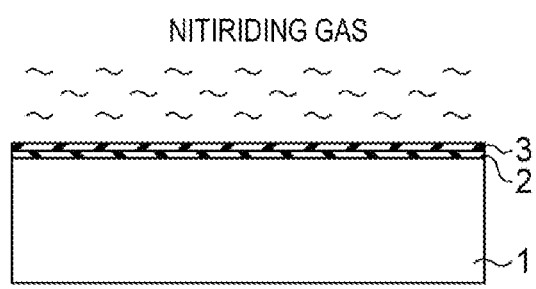

FIG. 7 is a flow chart showing one example of a film formation sequence of the silicon carbonitride film 3. FIG. 8 is a timing chart showing one example of a gas discharge timing. FIGS. 9A to 9C are sectional views showing one example of main processes in a film formation sequence of a silicon carbonitride film.

First, as shown in operation S21 of FIG. 7, FIG. 8 and FIG. 9A, a silicon film 7 (Si film) is formed on the boron nitride film 2 by supplying a silicon source gas into the interior of the processing chamber of the film formation apparatus (not shown), which accommodates the silicon wafer 1.

One example of processing conditions when forming the silicon film 7 is as follows:
 a silicon source gas:a dichlorosilane ($SiH_2Cl_2$:DCS);
 a flow rate of the silicon source gas: 500~3000 sccm;
 a processing time: 0.05~1.0 min;
 a processing temperature: 450~630 degrees C.; and
 a processing pressure: 13.3~1064 Pa (0.1~8.0 Torr).

In the above processing conditions, the silicon film 7 with the film thickness of about 0.3~1.0 nm is formed on the boron nitride film 2.

When operation S21 is finished, the interior of the processing chamber is purged by using the inert gas. The internal atmosphere of the processing chamber is substituted with the inert gas atmosphere. One example of the inert gas may be the nitrogen gas ($N_2$).

Next, as shown in operation S22 of FIG. 7, FIG. 8 and FIG. 9B, the silicon film 7 is carbonized to produce a silicon carbide film 8 (SiC film) by supplying a carbonizing gas into the interior of the processing chamber.

One example of processing conditions when carbonizing the silicon film 7 is as follows:
 a carbonizing gas: an ethylene ($C_2H_4$);
 a flow rate of the carbonizing gas: 3000 sccm;
 a processing time: 0.5~1.5 min (a supplying time of a carbonizing gas: 0.05~0.2 min, a hold time: 0.2~1.3 min);
 a processing temperature: 450~630 degrees C.; and
 a processing pressure: 133~666.5 Pa (1.0~5.0 Torr).

When operation S22 is finished, the interior of the processing chamber is purged by using the inert gas. The internal atmosphere of the processing chamber is substituted with the inert gas atmosphere, for example, the nitrogen gas atmosphere in this example.

Next, as shown in operation S23 of FIG. 7, FIG. 8 and FIG. 9C, the silicon carbide film 8 formed on the boron nitride film 2 is nitrided to produce a silicon carbonitride film 3 (SiCN film) by supplying the nitriding gas into the interior of the processing chamber.

One example of processing conditions when nitriding the silicon carbide film 8 is as follows:
 a nitriding gas: an ammonia ($NH_3$);
 a flow rate of the nitriding gas: 5000~10000 sccm;
 a processing time: 0.2~1.0 min;
 a processing temperature: 450~630 degrees C.; and
 a processing pressure: 13.3~666.5 Pa (0.1~5.0 Torr).

When operation S23 is finished, the interior of the processing chamber is purged by using the inert gas. The internal atmosphere of the processing chamber is substituted with the inert gas atmosphere, for example, the nitrogen gas atmosphere in this example. Hereby, one cycle of the film formation sequence of the silicon carbonitride film 3 is completed.

Next, as shown in operation S24 of FIG. 7, it is determined whether a cycle number reaches a predetermined number. If the cycle number reaches the predetermined number (Yes), forming the silicon carbonitride film 3 is finished. If the cycle number does not reach the predetermined number (No), the film formation sequence returns to operation S21 and repeatedly performs operations S21 to S23. Further, in case the cycle number is fixed to "1", operation S24 can be omitted.

Accordingly, for example, the silicon carbonitride film 3 is formed.

<Operation S3: An Example of a Method of Forming the Silicon Oxynitride Film 4>

Figure 10:
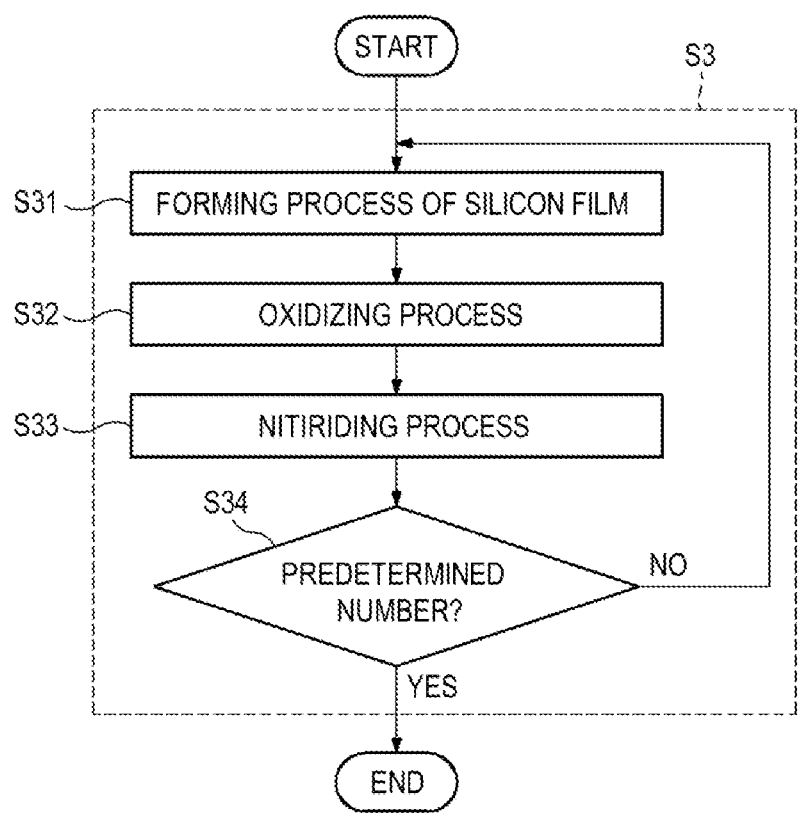
FIG. 10 is a flow chart showing one example of a film formation sequence of a silicon oxynitride film.
Figure 12A:
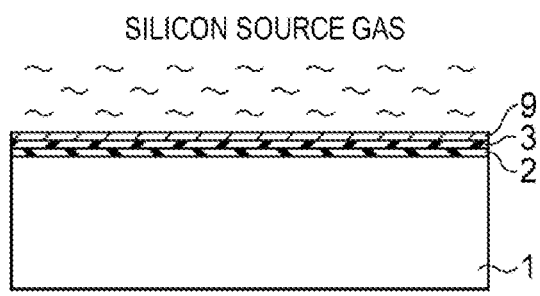
FIG. 12A to 12C are sectional views showing one example of main processes in the film formation sequence of the silicon oxynitride film.
Figure 12B:
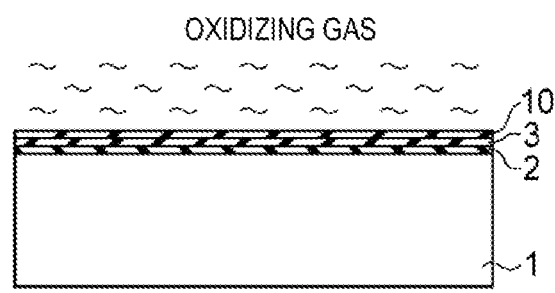
Figure 12C:
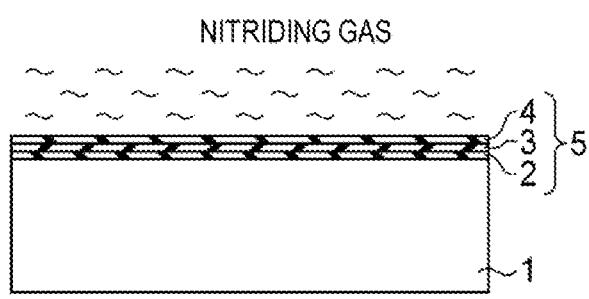

FIG. 10 is a flow chart showing one example of a film formation sequence of the silicon oxynitride film 4. FIG. 11 is a timing chart showing one example of a gas discharge timing. FIGS. 12A to 12C are sectional views showing one example of main processes in the film formation sequence of the silicon oxynitride film 4.

First, as shown in operation S31 of FIG. 10, FIG. 11 and FIG. 12A, a silicon film 9 (Si film) is formed on the silicon carbonitride film 3 by supplying the silicon source gas into the interior of the processing chamber of the film formation apparatus, which accommodates the silicon wafer 1.

One example of processing conditions when forming the silicon film 9 is as follows:

a silicon source gas:a dichlorosilane ($SiH_2Cl_2$:DCS);
a flow rate of the silicon source gas: 500~3000 sccm;
a processing time: 0.05~1.0 min;
a processing temperature: 450~630 degrees C.; and
a processing pressure: 13.3~1064 Pa (0.1~8.0 Torr).

In the above processing conditions, the silicon film 9 with the film thickness of about 0.3~1.0 nm is formed on the silicon carbonitride film 3.

When operation S31 is finished, the interior of the processing chamber is purged by using the inert gas. The internal atmosphere of the processing chamber is substituted with the inert gas atmosphere, for example, the nitrogen gas atmosphere in this example.

Next, as shown in operation S32 of FIG. 10, FIG. 11 and FIG. 12B, the silicon film 9 is oxidized to produce a silicon oxide film 10 (SiOx) by supplying an oxidizing gas into the interior of the processing chamber.

One example of processing conditions when oxidizing the silicon film 9 is as follows:

an oxidizing gas: an oxygen ($O_2$);
a flow rate of the oxidizing gas: 1000~10000 sccm;
a processing time: 0.1~1.0 min;
a processing temperature: 450~630 degrees C.; and
a processing pressure: 13.3~133 Pa (0.1~1.0 Torr).

When operation S32 is finished, the interior of the processing chamber is purged by using the inert gas. The internal atmosphere of the processing chamber is substituted with the inert gas atmosphere, for example, the nitrogen gas atmosphere in this example.

Next, as shown in operation S33 of FIG. 10, FIG. 11 and FIG. 12C, the silicon oxide film 10 is nitrided to produce a silicon oxynitride film 4 by supplying the nitriding gas into the interior of the processing chamber.

One example of processing conditions when nitriding the silicon oxide film 10 is as follows:

a nitriding gas: an ammonia ($NH_3$);
a flow rate of the nitriding gas: 5000~10000 sccm;
a processing time: 0.2~1.0 min;
a processing temperature: 450~630 degrees C.; and
a processing pressure: 13.3~666.5 Pa (0.1~5.0 Torr).

When operation S33 is finished, the interior of the processing chamber is purged by using the inert gas. The internal atmosphere of the processing chamber is substituted with the inert gas atmosphere, for example, the nitrogen gas atmosphere in this example. Hereby, one cycle of the film formation sequence of the silicon oxynitride film 4 is completed.

Next, as shown in operation S34 of FIG. 10, it is determined whether a cycle number reaches a predetermined number. If the cycle number reaches the predetermined number (Yes), forming the silicon oxynitride film 4 is finished. If the cycle number does not reach the predetermined number (No), the film formation sequence returns to operation S31 and repeatedly performs operations S31 to S33. Further, in case the cycle number is fixed to "1", operation S34 can be omitted.

Accordingly, for example, the silicon oxynitride film 4 is formed. Further, the boron-containing silicon oxycarbonitride film 5 is formed by laminating the silicon oxynitride film 4 on the silicon carbonitride film 3.

Second Embodiment

FIG. 13 is a flow chart showing one example of a method of forming a boron-containing silicon oxycarbonitride film according to a second embodiment of the present disclosure. FIGS. 14A to 14I are sectional view showing one example of main processes in the method of forming the boron-containing silicon oxycarbonitride film according to a second embodiment.

As shown in FIG. 13, the second embodiment is different from the first embodiment as the second embodiment further comprises operation S5 (forming a silicon nitride film) which is performed between operation S2 (forming the silicon carbonitride film 3) and operation S3 (forming the silicon oxynitride film 4). Except for that, other operations of the second embodiment may be identical with the first embodiment including the processing conditions.

Figure 14A:
FIGS. 14A to 14I are sectional views showing one example of main processes in the method of forming the boron-containing silicon oxycarbonitride film according to the second embodiment.
Figure 14E:
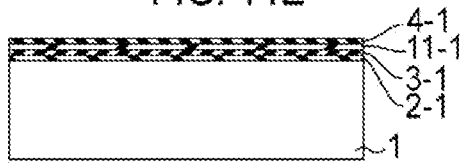
Figure 14B:
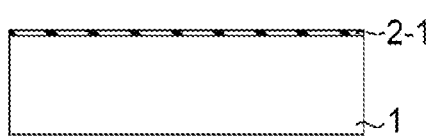

First, as shown in FIG. 14A, a semiconductor substrate is prepared. In this example, a silicon wafer 1 is used as the semiconductor substrate. Subsequently, the silicon wafer 1 is accommodated in a processing chamber of a film formation apparatus. Then, as shown in operation S1 of FIG. 13 and FIG. 14B, a boron nitride film 2-1 (BN film) is formed on a base. A silicon carbonitride film 3-1 is then formed on the boron nitride film 2-1, as shown in operation S2 of FIG. 13 and FIG. 14C. Next, as shown in operation S5 of FIG. 13 and FIG. 14D, a silicon nitride film 11-1 is formed on the silicon carbonitride film 3-1. As shown in operation S3 and FIG. 14E, a silicon oxynitride film 4-1 is then formed on the silicon nitride film 11-1. Hereby, one cycle of a film formation sequence of the boron-containing silicon oxycarbonitride film is completed.

Next, as shown in operation S4 of FIG. 13, it is determined whether a lamination number reaches a predetermined number. If the lamination number reaches the predetermined number (Yes), forming the boron-containing silicon oxycarbonitride film is finished. If the lamination number is "1", the boron-containing silicon oxycarbonitride film (SiBOCN film) is formed by laminating the boron nitride film 2-1, the silicon carbonitride film 3-1, the silicon nitride film 11-1 and the silicon oxynitride film 4-1 one layer by one layer. In case the lamination number is fixed to "1", operation S4 can be omitted.

Figure 14F:
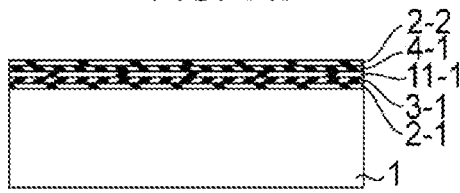
Figure 14C:
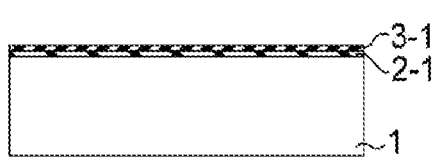
Figure 14G:
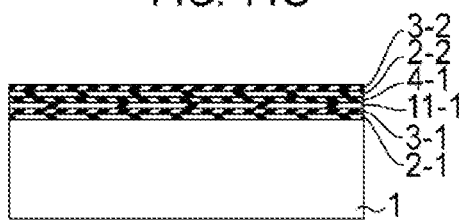
Figure 14D:
Figure 14H:
Figure 14I:
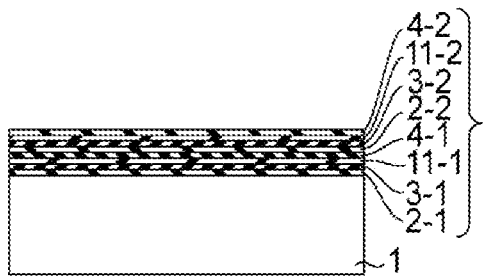

If the lamination number does not reach the predetermined number (No), the method returns to operation S1. As shown in FIG. 14F, a second layered boron nitride film 2-2 is formed on the silicon oxynitride film 4-1. Then, as shown in operation S2 of FIG. 13 and FIG. 14G, a second layered silicon carbonitride film 3-2 is formed. Next, a second layered silicon nitride film 11-2 is formed, as shown in operation S5 of FIG. 13 and FIG. 14H, and then, as shown in operation S3 of FIG. 13 and FIG. 14I, a second layered silicon oxynitride film 4-2 is formed.

Next, as shown in operation S4 of FIG. 1, it is again determined whether a lamination number reaches a predetermined number. If the lamination number reaches the predetermined number (Yes), forming the boron-containing silicon oxycarbonitride film is finished. If the lamination number does not reach the predetermined number (No), operations S1, S2, S5 and S3 shown in FIG. 13 are repeatedly performed until the lamination number reaches the predetermined number. With this configuration, the boron-containing silicon oxycarbonitride film 5a is formed.

Further, the method of forming the boron-containing silicon oxycarbonitride film according to the second embodiment forms the silicon carbonitride film 3 and the silicon oxynitride film 4 after forming the boron nitride film 2 on the base identically with the first embodiment. With this configuration of the second embodiment, it is possible to enhance a growth rate of the boron-containing silicon oxycarbonitride film 5a, thereby reducing a processing time identically with the first embodiment.

Further, in the second embodiment, the silicon nitride film 11 is formed on the silicon carbonitride film 3. In this way, since the silicon nitride film 11 is formed on the silicon carbonitride film 3 when forming the silicon oxynitride film 4 (operation S3), it is possible to restrain a volatilization of a carbon (C) from the silicon carbonitride film 3. Due to the restrain of the volatilization of the carbon (C) from the silicon carbonitride film 3, it is possible to include the carbon of a higher concentration within the boron-containing silicon oxycarbonitride film 5a according to the second embodiment than the boron-containing silicon oxycarbonitride film 5 according to the first embodiment. Since the boron-containing silicon oxycarbonitride film 5a contains the carbon of the high concentration, it is possible to obtain an advantage of enhancing both the dry etching resistance and the wet etching resistance.

Figure 15:
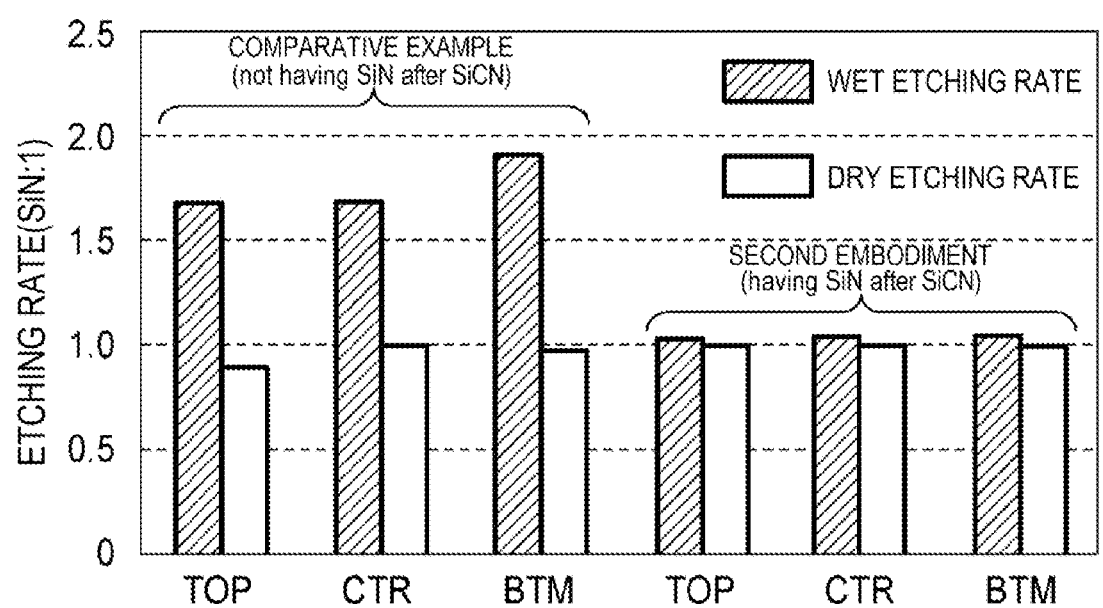
FIG. 15 shows etching rates of the boron-containing silicon oxycarbonitride film (having SiN after SiCN) according to the second embodiment and a silicon oxycarbonitride film (not having SiN after SiCN) according to a comparative example.

FIG. 15 shows etching rates of the boron-containing silicon oxycarbonitride film (having SiN after SiCN) according to the second embodiment and a silicon oxycarbonitride film (not having SiN after SiCN) according to a comparative example. Further, FIG. 15 shows relative etching rates in case an etching rate of the silicon nitride film (SiN) is "1."

As shown in FIG. 15, in the comparative example, the etching rate according to the dry etching is almost similar with the etching rate of the silicon nitride film. However, the etching rate according to the wet etching is about 1.5 to 2 times higher than the etching rate of the silicon nitride film. Thus, the wet etching resistance tends to become weak.

On the contrary, in the second embodiment, both the etching rate according to the dry etching and the etching rate according to the wet etching are almost similar with those of the silicon nitride film.

Accordingly, the boron-containing silicon oxycarbonitride film 5a, which is formed by the method according to the second embodiment, can have an advantage of enhancing the wet etching resistance when compared with the comparative example.

Wet etching conditions according to the second embodiment are as follows:
an etchant: a rare hydrofluoric acid ($H_2O:HF=100:1$); and
a processing time: 60 sec.
Dry etching conditions are as follows:
an etchant: mixing gases of $CHF_3$, $CF_4$, $O_2$
a processing time: 5 sec
Hereinafter, one example of a detailed film formation sequence according to operation S5 will be described.
<Operation S5: An Example of a Method of Forming the Silicon Nitride Film 11>

Figure 16:
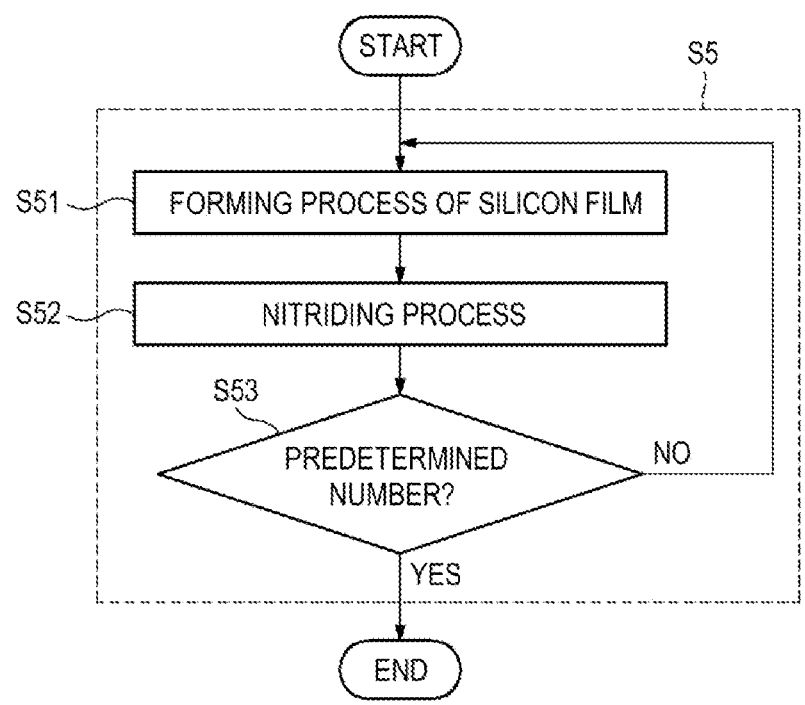
FIG. 16 is a flow chart showing one example of a film formation sequence of a silicon nitride film.
Figure 18A:
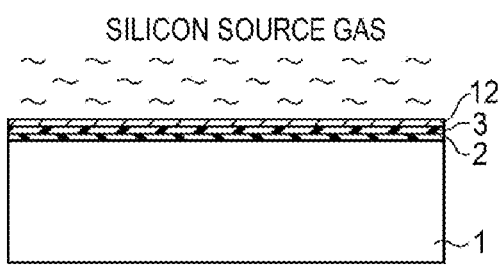
FIGS. 18A and 18B are sectional views showing one example of main processes in the film formation sequence of the silicon nitride film.
Figure 18B:
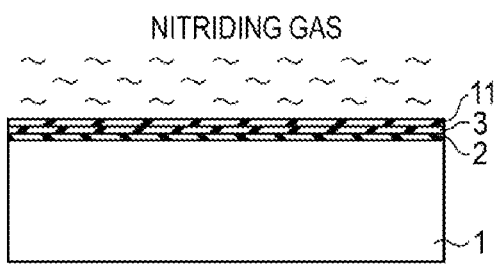

FIG. 16 is a flow chart showing one example of a film formation sequence of the silicon nitride film 11. FIG. 17 is a timing chart showing one example of a gas discharge timing. FIGS. 18A and 18B are sectional views showing one example of main processes in the film formation sequence of the silicon nitride film 11.

First, as shown in operation S51 of FIG. 16, FIG. 17 and FIG. 18A, a silicon film 12 is formed on the silicon carbonitride film 3 by supplying the silicon source gas into the interior of the processing chamber of the film formation apparatus, which accommodates the silicon wafer 1.

One example of processing conditions when forming the silicon film 12 is as follows:
a silicon source gas: a dichlorosilane ($SiH_2Cl_2$:DCS);
a flow rate of the silicon source gas: 500~3000 sccm;
a processing time: 0.05~1.0 min;
a processing temperature: 450~630 degrees C.; and
a processing pressure: 13.3~1064 Pa (0.1~8.0 Torr).
In the above the processing conditions, the silicon film 12 is with the film thickness of about 0.3 to 1.0 nm is formed on the silicon carbonitride film 3.

When operation S51 is finished, the interior of the processing chamber is purged by using the inert gas. The internal atmosphere of the processing chamber is substituted with the inert gas atmosphere. One example of the inert gas may be the nitrogen gas ($N_2$).

Next, as shown in operation S52 of FIG. 16, FIG. 17 and FIG. 18B, the silicon film 12 is nitrided to produce the silicon nitride film 11 (SiN).

One example of processing conditions when nitriding the silicon film 12 is as follows:
a nitriding gas: an ammonia ($NH_3$);
a flow rate of the nitriding gas: 1000~10000 sccm;
a processing time: 0.1~3.0 min;
a processing temperature: 450~630 degrees C.; and
a processing pressure: 13.3~666.5 Pa (0.1~5.0 Torr).

When operation S52 is finished, the interior of the processing chamber is purged by using the inert gas. The internal atmosphere of the processing chamber is substituted with the inert gas atmosphere, for example, the nitrogen gas atmosphere in this example. Hereby, one cycle of the film formation sequence of the silicon nitride film 11 is completed.

Next, as shown in operation S53 of FIG. 16, it is determined whether a cycle number reaches a predetermined number. If the cycle number reaches the predetermined number (Yes), forming the silicon nitride film 11 is finished. If the cycle number does not reach the predetermined number (No), the film formation sequence returns to operation S51 and repeatedly performs operations S51 and S52. Further, in case the cycle number is fixed to "1", operation S53 can be omitted.

Accordingly, for example, the silicon nitride film 11 is formed.

Third Embodiment

Figure 19:
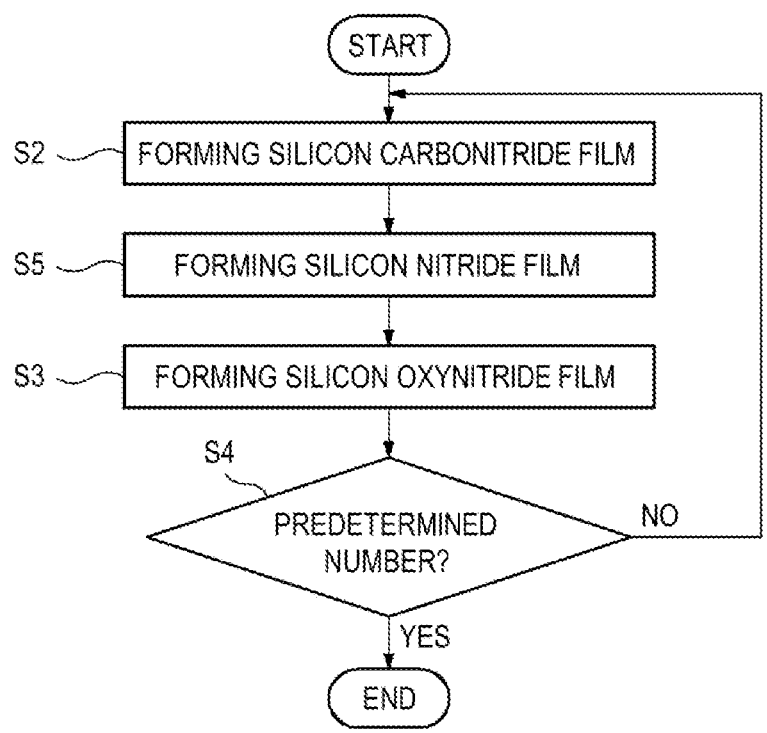
FIG. 19 is a flow chart showing one example of a method of forming a silicon oxycarbonitride film according to a third embodiment of the present disclosure.

FIG. 19 is a flow chart showing one example of a method of forming a silicon oxycarbonitride film according to a third embodiment of the present disclosure.

As shown in FIG. 19, the third embodiment is different from the second embodiment as the third embodiment does not include operation S1 (forming the boron nitride film). Except for that, the operations in the third embodiment may be identical with those in the second embodiment including the processing conditions.

If the silicon nitride film 11 is formed on the silicon carbonitride film 3 in the same method as the second embodiment, operation S1 which forms the boron nitride film 2 can be omitted. Since the boron is not contained in case of omitting operation S1, the silicon oxycarbonitride film is simply formed.

Further, in case of omitting operation S1, it is difficult to obtain the advantage of enhancing a film formation rate. However, since the silicon nitride film 11 is formed on the silicon carbonitride film 3, the silicon oxycarbonitride film to be formed contains the carbon of the high concentration. As a result, it is possible to obtain the advantage of enhancing both the dry etching resistance and the dry etching resistance.

In this way, operation S1 may be added or omitted in accordance with a required specification.

Other Advantages According to the First to Third Embodiments

In the first embodiment, the boron-containing silicon oxycarbonitride film 5 is formed by laminating the boron nitride film 2, the silicon carbonitride film 3 and the silicon oxynitride film 4.

Further, in the second embodiment, the boron-containing silicon oxycarbonitride film 5a is formed by laminating the boron nitride film 2, the silicon carbonitride film 3, the silicon nitride film 11 and the silicon oxynitride film 4.

Further, in the third embodiment, although not shown specifically in the drawings, the silicon oxycarbonitride film is formed by laminating the silicon carbonitride film 3, the silicon nitride film 11 and the silicon oxynitride film 4 in accordance with the second embodiment.

As an advantage of the above-described forming method, an oxygen (O) concentration, the carbon (C) concentration and the nitrogen (N) concentration in the formed boron-containing silicon oxycarbonitride films 5, 5a or the formed silicon oxycarbonitride film can be controlled with a high accuracy in a film thickness direction perpendicular to the surface to be processed in its entirety.

Figure 20:
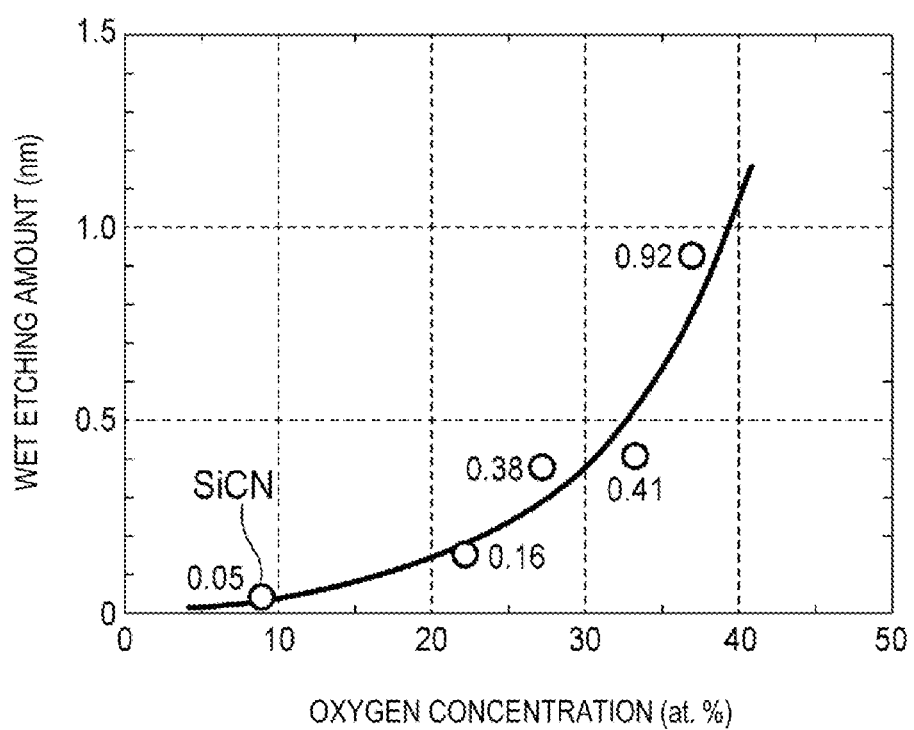
FIG. 20 shows a relationship between an oxygen concentration and a wet etching amount.
Figure 21:
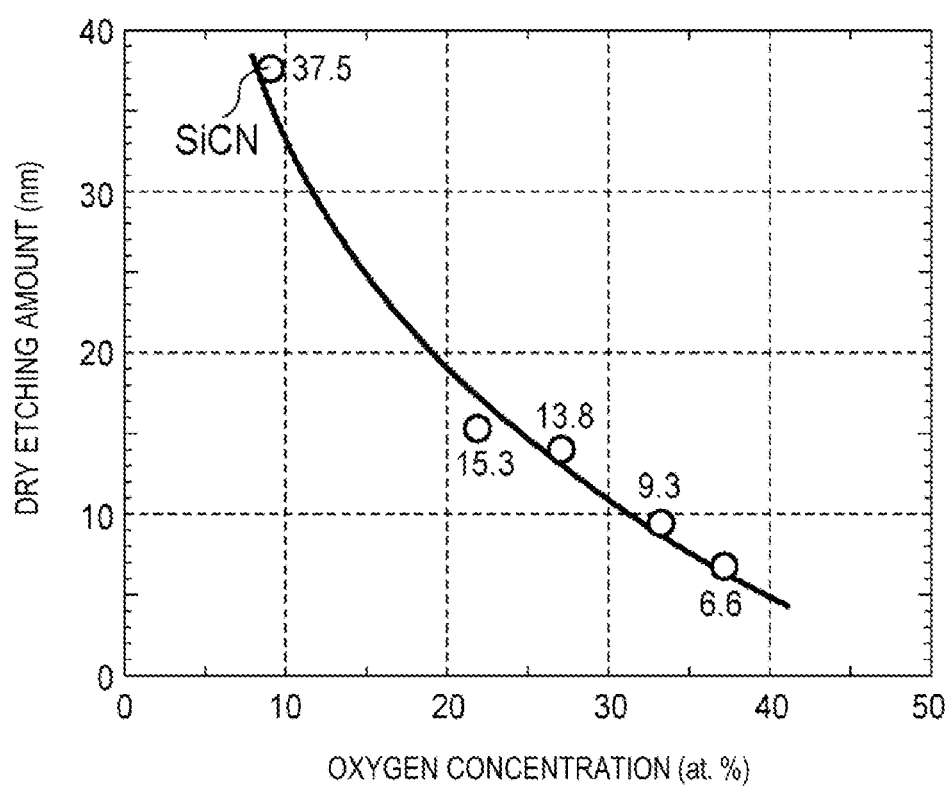
FIG. 21 shows a relationship between an oxygen concentration and a dry etching amount.

FIG. 20 shows a relationship between an oxygen concentration and a wet etching amount. FIG. 21 shows a relationship between an oxygen concentration and a dry etching amount. FIGS. 20 and 21 illustrate a silicon carbonitride film which does not include an intended oxygen introduction and includes an oxygen of about 8.8% naturally oxidized on the silicon wafer as a comparative example in order to help understanding of the silicon oxycarbonitride film according to the embodiments.

The wet etching conditions are as follows:
an etchant: rare hydrofluoric acid ($H_2O$:HF=100:1); and
a processing time: 60 sec.

Further, the dry etching conditions are as follows:
an etchant: mixing gases of $CHF_3$, $CF_4$ and $O_2$; and
a processing time: 5 sec.

As shown in FIG. 20, the silicon carbonitride film (SiCN film) is scarcely etched by the rare hydrofluoric acid. If the silicon carbonitride film becomes the silicon oxycarbonitride film by intentionally introducing the oxygen in accordance with the embodiments and the oxygen concentration increases, the silicon oxycarbonitride film is apt to be etched by the rare hydrofluoric acid. That is, it can be understood that the wet etching resistance tends to increase if the silicon oxycarbonitride film has a low oxygen concentration.

Further, in case the silicon nitride film 11 is formed on the silicon carbonitride film 3 as in the second and third embodiments, it is possible to restrain a volatilization of the carbon (C) from the silicon carbonitride film 3. Thus, as shown in FIG. 15, it is possible to restrain the wet etching amount to its lower level even if the oxygen concentration is high.

Further, as shown in FIG. 21, the silicon carbonitride film (SiCN film) is etched in a significant amount with the mixing gases of $CHF_3$, $CF_4$ and $O_2$. However, if the silicon oxycarbonitride film is obtained by containing the oxygen and the oxygen concentration increases, it goes difficult to etch. That is, if the silicon oxycarbonitride film has a low oxygen concentration, its dry etching resistance increases.

Accordingly, the oxygen concentration within the silicon oxycarbonitride film influences on the wet etching resistance and the dry etching resistance of the silicon oxycarbonitride film, respectively.

As describe above, since the method according to the embodiments includes forming the silicon oxycarbonitride film by laminating the silicon carbonitride film 3 and the silicon oxynitride film 4, the oxygen concentration, the carbon concentration and the nitrogen concentration within the silicon oxycarbonitride film can be controlled with a high accuracy in the film thickness direction in its entirety. It is possible to control the oxygen concentration by adjusting the film formation amount of the silicon oxynitride film 4, the carbon concentration by adjusting the film formation amount of the silicon carbonitride film 3, and the nitrogen concentration by adjusting both the film formation amount of the silicon oxynitride film 4 and the film formation amount of the silicon carbonitride film 3.

Further, if the boron nitride film 2 is further formed on the base or the silicon oxynitride film 4 in accordance with the first and second embodiments, the nitrogen concentration can be controlled by further adjusting the film formation amount of the boron nitride film 2.

Further, if the silicon nitride film 11 is further formed on the silicon carbonitride film 3 in accordance with the second and third embodiments, the nitrogen concentration and the carbon concentration can be controlled by more adjusting the film formation amount of the silicon nitride film 11.

Therefore, according to the embodiments, for example, by controlling the oxygen concentration or the carbon concentration, it is possible to obtain the following films high accurately:

i) the boron-containing silicon oxycarbonitride film or the silicon oxycarbonitride film, particularly with an excellent wet etching resistance;

ii) the silicon oxycarbonitride film, particularly with an excellent dry etching resistance; and iii) the silicon oxycarbonitride film with the both excellent wet etching resistance and dry etching resistance.

Fourth Embodiment

The fourth embodiment relates to one example of a film formation apparatus which can carry out the method of forming the boron-containing silicon oxycarbonitride film according to the first and second embodiments or the method of forming the silicon oxycarbonitride film according to the third embodiment.

Figure 22:
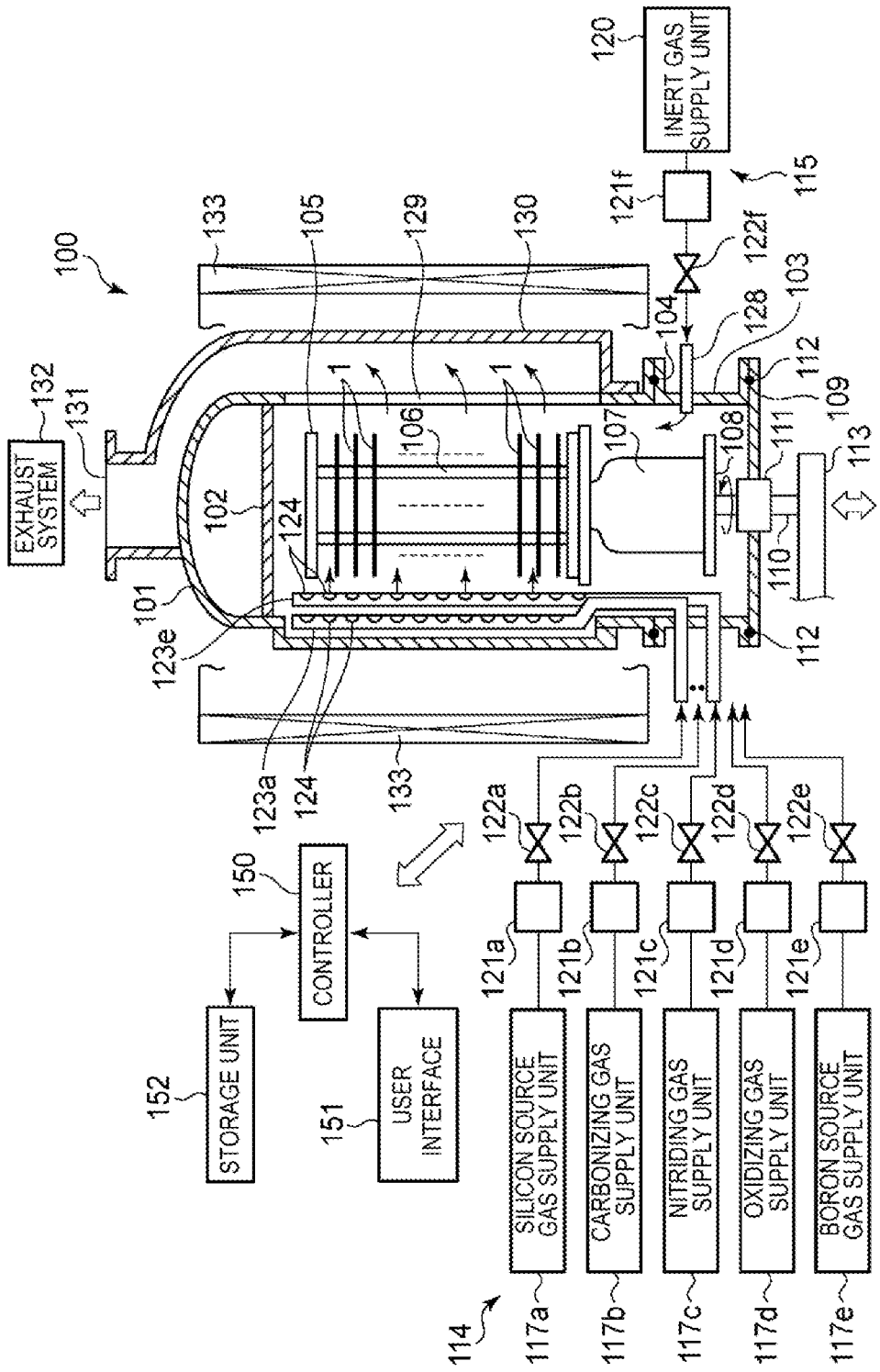
FIG. 22 is a schematic sectional view showing one example of a film formation apparatus which can carry out the methods of forming the boron-containing silicon oxycarbonitride film according to the first and second embodiments or the method of forming the silicon oxycarbonitride film according to a third embodiment.

FIG. 22 is a schematic sectional view showing one example of the film formation apparatus which can carry out the method of forming the boron-containing silicon oxycarbonitride film according to the first and second embodiments or the method of forming the silicon oxycarbonitride film according to the third embodiment.

As shown in FIG. 22, the film formation apparatus 100 includes a cylindrical processing chamber 101 with a ceiling having an opened lower end. The processing chamber 101 is entirely made of, for example, quartz. A ceiling plate 102, for example, made of quartz, is provided in the ceiling within the processing chamber 101. A cylindrical manifold 103 made of stainless steel is connected to the opened lower end of the processing chamber 101 through a seal member 104 such as an O-ring.

The manifold 103 supports the lower end of the processing chamber 101. A wafer boat 105, made of quartz, in which a plurality of semiconductor substrates, as an object to be processed, for example, 50 to 100 wafers, for example, the silicon wafer 1 in this embodiment, are stacked, can be fit into the processing chamber 101 from the lower side of the manifold 103. The wafer boat 105 includes a plurality of rods 106 and supports the plurality of silicon wafers 1 by a groove formed on the rods 106.

The wafer boat 105 is stacked on a table 108 by a heat insulation tube 107 made of quartz. The table 108 is supported on a rotating shaft 110 penetrating a lid member 109 which is made of, e.g., stainless steel, and serves to open and close an opened lower end of the manifold 103. For example, a magnetic fluid seal 111 is installed at a penetrating portion of the rotating shaft 110 to air-tightly seal and rotatably supports the rotating shaft 110. A sealing member 112 including, e.g., an O-ring, is installed between a periphery of the lid member 109 and the lower end portion of the processing chamber 101. Thus, a sealing performance within the processing chamber 101 is maintained. The rotating shaft 110 is mounted on an end of an arm 113 supported by an elevating mechanism (not shown) such as a boat elevator. Thus, the wafer boat 105 and the lid member 109 moves up and down integrally to be fit into and separated from the processing chamber 101.

The film formation apparatus 100 includes a processing gas supply system 114 which supplies a gas used for processing into the processing chamber 101 and an inert gas supply system 115 which supplies an inert gas into the processing chamber 101. In this example, the processing gas supply system 114 includes a silicon source gas supply unit 117a, a carbonizing gas supply unit 117b, a nitriding gas supply unit 117c, an oxidizing gas supply unit 117d and a boron source gas supply unit 117e. The inert gas supply system 115 includes an inert gas supply unit 120.

One example of the silicon source gas may be a dichlorosilane, one example of the carbonizing gas may be an ethylene, one example of the nitriding gas may be an ammonia, one example of the oxidizing gas may be an oxygen, one example of the boron source gas may be a boron trichloride, one example of the inert gas may be a nitrogen gas. The inert gas is used as a purge gas.

The silicon source gas supply unit 117a is connected to a diffusion nozzle 123a through a flow rate controller 121a and an opening/closing valve 122a. Similarly, the carbonizing gas supply unit 117b, the nitriding gas supply unit 117c, the oxidizing gas supply unit 117d and the boron source gas supply unit 117e are connected to diffusion nozzles 123b to 123e through flow rate controllers 121b to 121e and opening/closing valves 122b to 122e, respectively.

The diffusion nozzles 123a to 123e are made of quartz, which inwardly pass through a side wall of the manifold 103 to be bent upwardly to extend vertically. A plurality of discharge holes 124 is formed on vertical portions of the diffusion nozzles 123a to 123e to be spaced at a predetermined pitch. Thus, each of gases is uniformly discharged horizontally from the discharge holes 124 into the processing chamber 101.

The inert gas supply unit 120 is connected to a nozzle 128 through a flow rat controller 121f and an opening/closing valve 122f. The nozzle 128 penetrates through the side wall of the manifold 103 to discharge the inert gas horizontally from a front end thereof into the processing chamber 101.

An exhaust opening 129 for exhausting the interior of the processing chamber 101 is installed at an opposite portion to the diffusion nozzles 123a to 123e in the interior of the processing chamber 101. The exhaust opening 129 is thinly elongated by cutting the side wall of the processing chamber 101 vertically. A discharge opening cover member 130, which is U-shaped to cover the exhaust opening 129, is mounted to a portion corresponding to the exhaust opening 129 of the processing chamber 101 by means of a welding. The discharge opening cover member 130 extends upwardly along the side wall of the processing chamber 101 and forms a gas outlet 131 in an upper side of the processing chamber 101. An exhaust system 132 including a vacuum pump is connected to the gas outlet 131. The exhaust system 132 exhausts the gas, which was used for processing, and pressurizes a pressure of the interior of the processing chamber 101 to a processing pressure by exhausting the interior of the processing chamber 101.

A cylindrical heater 133 is installed in a periphery of the processing chamber 101. The heater 133 heats the object to be processed, for example, the silicon wafer 1 in this example, which is accommodated in the interior of the processing chamber 101 while activating the gases supplied to the interior of the processing chamber 101.

Each units in the film formation apparatus 100 is controlled by a controller 150 including, for example, a microprocessor (a computer). The controller 150 is connected to a touch panel through which an operator inputs a command and operates for managing the film formation apparatus 100, or a user interface 151 including a display which visualizes and displays a driving state of the film formation apparatus 100.

A storage unit 152 is connected to the controller 150. The storage unit 152 stores a control program for performing kind of processes which are carried out in the film formation apparatus 100 by controlling the controller 150, or a program (i.e., a recipe) for performing the process in each of configurations of the film formation apparatus 100 correspondingly to the processing conditions. The recipe is stored in, for example, a storage medium of the storage unit 152. The storage medium may include a hard disc, a semiconductor memory, or a portable medium such as a CD-ROM, a DVD and a flash memory. Further, the recipe may be appropriately transmitted from another device, for example, a private line. As occasion demands, when the recipe is read from the storage unit 152 by an instruction from the user interface 151, the controller 150 carries out the process correspondingly to the read recipe. Thus, the film formation apparatus 100 carries out a required process under a control of the controller 150.

In this example, processes according to the method of forming the silicon oxycarbonitride film in the first to third embodiments are sequentially performed under the control of the controller 150.

The method of forming the boron-containing silicon oxycarbonitride film according to the first and second embodiments and the method of forming the silicon oxycarbonitride film according to the third embodiment can be carried out through only one film formation apparatus by using the film formation apparatus 100 shown in FIG. 22.

Further, the film formation apparatus is not limited to the batch type shown in FIG. 22 and may include a film formation apparatus of a single wafer processing type.

For example, the processing conditions are specifically exemplified in the embodiments but are not limited to the specific example.

Further, although forming the silicon oxynitride film (operation S3) is a final process in FIGS. 1 and 13, forming the silicon carbonitride film may be become a final process by adding forming the silicon carbonitride film after operation S3.

Further, although the nitriding process (operation S23) is a final process in FIG. 7, the carbonizing process may be become a final process by adding the carbonizing process after operation S24. Similarly, although the oxidizing process (operation S33) is a final process in FIG. 10, the oxidizing process may be become a final process by adding the oxidizing process after operation S33.

Further, an oxidation in the oxidizing process may use any one of an ozone oxidation by an ozone gas and a radical oxidation by using an oxygen radical besides an oxygen oxidation by the oxygen gas. Similarly, a nitration in the nitriding process may use a radical nitration by using an ammonia radical besides a nitration by an ammonia gas.

According to the embodiments of the present disclosure, it is possible to provide the method of forming the boron-containing silicon oxycarbonitride film, which can enhance the throughput by reducing the processing time.

Further, it is possible to provide the method of forming the silicon oxycarbonitride film, which can form the silicon oxycarbonitride film with the both excellent dry etching resistance and wet etching resistance.

While certain embodiments have been described, these embodiments have been presented by way of example only, and are not intended to limit the scope of the present disclosure. Indeed, the novel methods and apparatuses described herein may be embodied in a variety of other forms or combinations; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A method of forming a boron-containing silicon oxycarbonitride film on a base, comprising:
    forming a boron-containing film on the base; and
    forming the boron-containing silicon oxycarbonitride film by laminating a silicon carbonitride film and a silicon oxynitride film on the boron-containing film,
    wherein forming the boron-containing film, forming the silicon carbonitride film, and forming the silicon oxynitride film are repeatedly performed for a predetermined number.

2. The method of claim 1, wherein forming the silicon carbonitride film comprises a carbonizing process and a nitriding process of a silicon film, and
    wherein forming the silicon oxynitride film comprises an oxidizing process and a nitriding process of the silicon film.

3. The method of claim 2, wherein the carbonizing process and the nitriding process of the silicon film are repeatedly performed for a predetermined number in forming the silicon carbonitride film.

4. The method of claim 2, wherein the oxidizing process and the nitriding process of the silicon film are repeatedly performed for a predetermined number in forming the silicon oxynitride film.

5. The method of claim 1, further comprising forming a silicon nitride film after forming the silicon carbonitride film and before forming the silicon oxynitride film.

6. A method of forming a silicon oxycarbonitride film on a base, comprising:
    forming the silicon oxycarbonitride film by forming a boron-containing film on the base, forming a silicon carbonitride film on the boron-containing film, forming a silicon nitride film on the silicon carbonitride film and forming a silicon oxynitride film on the silicon nitride film.

7. The method of claim 6, wherein forming the silicon carbonitride film, forming the silicon nitride film and forming the silicon oxynitride film are repeatedly performed for a predetermined number.

8. The method of claim 6, wherein forming the silicon carbonitride film comprises a carbonizing process and a nitriding process of a silicon film, and
    wherein forming the silicon oxynitride film comprises an oxidizing process and a nitriding process of the silicon film.

9. The method of claim 8, wherein the carbonizing process and the nitriding process of the silicon film are repeatedly performed for a predetermined number in forming the silicon carbonitride film.

10. The method of claim 8, wherein the oxidizing process and the nitriding process of the silicon film are repeatedly performed for a predetermined number in forming the silicon oxynitride film.

* * * * *